United States Patent
Radhakrishnan

[11] Patent Number: 5,858,478
[45] Date of Patent: Jan. 12, 1999

[54] MAGNETIC FIELD PULSED LASER DEPOSITION OF THIN FILMS

[75] Inventor: Gouri Radhakrishnan, Culver City, Calif.

[73] Assignee: The Aerospace Corporation, El Segundo, Calif.

[21] Appl. No.: 982,666

[22] Filed: Dec. 2, 1997

[51] Int. Cl.⁶ .................................................. H05H 1/02
[52] U.S. Cl. .................. 427/571; 427/249; 427/255.2; 427/294; 427/547; 427/571; 427/577; 427/585; 427/586; 427/596; 427/598
[58] Field of Search .................................. 427/571, 576, 427/577, 585, 596, 586, 598, 249, 255.2, 294, 547

[56] References Cited

U.S. PATENT DOCUMENTS

| | | | |
|---|---|---|---|
| 4,689,463 | 8/1987 | Shubert | 219/76.16 |
| 4,745,256 | 5/1988 | Shubert | 219/121.47 |
| 5,015,492 | 5/1991 | Venkatesan et al. | 427/8 |
| 5,028,584 | 7/1991 | Schultheiss et al. | 505/1 |
| 5,126,165 | 6/1992 | Akihama et al. | 427/53.1 |
| 5,212,151 | 5/1993 | Takano et al. | 505/1 |
| 5,411,772 | 5/1995 | Cheun et al. | 427/586 |
| 5,614,114 | 3/1997 | Owen | 219/121.66 |
| 5,660,746 | 8/1997 | Witanachchi et al. | 219/121.66 |

OTHER PUBLICATIONS

"Off Axis Laser Deposition of Yba$_2$CU$_3$O$_{7-\delta}$ Thin Films", Holzapfel, et al. Appl. Phys. Lett. 61, pp. 3178–3180, Dec. 1992.

"Velocity Distribution of Micron Size Particles in Thin Film Laser Ablation Deposition of Metals and Oxide Superconductors", Dupendant, et al. Applied Surface Science 43, pp. 369–376, 1989 (no month avail.).

"Laser Induced Plasmas for Primary Ion Deposition of Epitaxial Ge and Si Films", Lubben, et al., J. Vac Sci. Tech. B, vol. 3, No. 4, pp. 968–974, Jul. 1985.

"Pulsed Laser Deposition of Particulate-Free Thin Films Using a Curved Magnetic Filter", Jordon, et al. Applied Surface Science 109/110, pp. 403–407, Feb. 1997.

*Primary Examiner*—Bernard Pianalto
*Attorney, Agent, or Firm*—Derrick Michael Reid

[57] ABSTRACT

The present invention relies upon a free space magnetic field in a pulsed laser deposition (PLD) chamber for forming high quality thin films made from diverted ions from a plume evaporated from an ablated target illuminated by a pulsed laser beam. The magnetic field exerts a qv×B Lorentz force upon the ions that is orthogonal to the magnetic field and to their direction of travel in the plume, and curves the ions toward the substrate, while neutral particulates continue to pass by the substrate so that the large neutral particulates are not deposited on the substrate. A shield prevents the deposition of plume species in direct line of sight between the target and the substrate so that only charged ions curved by the magnet are deposited on the substrate. A permanent magnet is used to separate charged species from neutral species. The magnetic field deflects the charged species away from the primary direction of travel of the plume and toward the substrate for deposition of the charged ion species on the substrate. The method provides particulate-free films having improved crystallinity, uniformity and adhesion.

5 Claims, 2 Drawing Sheets

Ion Deflection

Magnetic Field Pulsed Laser Deposition System

Ion Deflection

MAGNETIC FIELD PULSED LASER DEPOSITION OF THIN FILMS

STATEMENT OF GOVERNMENT INTEREST

The invention was made with Government support under Contract No. FO4701-93-C-0094 by the Department of the Air Force. The Government has certain rights in the invention. The invention described herein may be manufactured and used by and for the government of the United States for governmental purpose without payment of royalty therefor.

SPECIFICATION

1. Field of Invention

The present invention relates to processes for forming thin films. More particularly, the present invention relates to pulsed laser deposition methods using a desired target material for forming high quality thin films on a substrate.

2. Background of the Invention

Pulsed laser deposition (PLD) is a versatile deposition technique that has been in use for several years. It is based upon the evaporation of a target material by a high power laser, with its subsequent collection on a desired substrate forming a film on the substrate. The PLD method has many advantages including the ease of deposition, and the formation of crystalline films with good adhesion at low temperatures, even as low as room temperature. Another advantage of the PLD technique is the ability to reproduce the stoichiometry of the target in the film, including that of multi-component targets. PLD is desirable for routine deposition at room or higher temperatures providing high quality crystalline thin films.

Different methods have been used to reduce the problem of producing clean, particulate-free thin films of any material of choice using PLD. This method is typically used in superconductor film growth processes and other coating processes for forming high quality thin films. PLD involves laser ablation and evaporation of a target material by a high power laser. The ablated material forms a plume comprising both undesirable large neutral particulates and desirable atoms and ions all of which get deposited on a substrate. The plume extends in a direction outward from the target. Typically, the substrate is held directly in front of the target, at a distance of a few inches. Examples of various pulsed laser deposition methods include those taught by Takano, et. al., U.S. Pat. No. 5,212,151, Schultheiss, et. al. U.S. Pat. No. 5,028,584, Venkatesan, et. al., U.S. Pat. No. 5,015,492, and Owen, U.S. Pat. No. 5,614,114.

However, the PLD technique has one continuing problem that has been extremely difficult to solve, namely the inclusion of undesirable particulates, typically 0.1 to 5.0 μm in size, which disadvantageously limits PLD commercialization. Conventional PLD methods disadvantageously produce about 400 particles $cm^2/Å$ particle density. Typically, laser ablation of the target results in the creation of charged and neutral species in many different sizes. Only species of atomic dimensions of the target material are desired to be deposited on the substrate. If large sized particulates form on the substrate, they limit the uniformity of the deposited thin film and its applications. The origin of these particulates is thought to be multifaceted. Factors include protruding surfaces, craters, micro-cracks in the target that are mechanically dislodged due to laser-induced thermal or mechanical shock, rapid expulsion of trapped gas bubbles beneath the target surface during laser irradiation, and the splashing of molten layers of target material.

For most applications, the creation of large particulates poses a serious problem. For tribological applications, it is desirable to deposit coatings with very high hardness on precision bearings. These hard coatings can protect the steel surfaces of bearings from wear, and thereby improve the bearing lifetime. This can be extremely valuable in improving the performance of moving mechanical assemblies in a variety of applications such as machinery, pumps etc. PLD is an ideal technique for depositing such hard coatings, however, the incorporation of hard particulates in the coatings can be detrimental to the bearings. Particulates, especially those of a hard material, can be abrasive and destroy the coating, leading to the production of more debris, and eventually to loss of coating adhesion. The loss of the coating adhesion is highly undesirable. If the coated bearing is used in conjunction with a liquid lubricant, the particulates and debris can also impede the smooth flow of lubricant through a bearing assembly, consequently leading to failure.

The inclusion of particulates during PLD poses a big problem when materials for high performance optical, electronic and microelectromechanical systems (MEMS) are deposited. In general, for these applications, stringent constraints exist for surface smoothness, therefore the tolerance to particulate density and size is generally low. In particular, for multilayer device fabrication, the presence of large particulates that get permanently implanted into the film can limit the resolution, size, and functionality of features that are to be fabricated.

A number of attempts have been made to reduce the particulate density in a PLD film. These include the use of an off-axis method where the substrate is positioned parallel to the plume, a velocity filter method to selectively allow particulates of lower mass, and the dual overlapping laser method. Each of these methods has certain shortcomings.

The off-axis method is taught by Cheung et. al. in U.S. Pat. No. 5,411,772. Cheung teaches a deposition configuration which places a substrate parallel to the propagation direction of the plume which is produced when the laser beam impinges upon a target. The substrate disadvantageously extends parallel to the plume limiting film growth. Material deposition on the substrate can only occur from species in the plume that have a significant velocity component perpendicular to the plume propagation direction. This method disadvantageously relies on the presence of a background gas having a pressure range of 0.1 to 0.001 Torr. The role of the background gas is to cause collisions with the ablated species. Lighter particulates such as atoms and ions can be scattered toward the substrate through collisions, while heavy particulates do not experience a significant lateral diffusion and therefore proceed along their original paths without depositing on the substrate. The necessity for random collisions disadvantageously limits the crystallinity of the films produced at low temperatures, and restricts the growth rate seriously.

The velocity filter method is for eliminating large particulates and relies on the fact that large particles tend to have lower velocities than particles of atomic dimensions. The method uses a filter that will only allow species having a predetermined velocity to pass through this filter and deposit on a substrate. This method has been suggested by Akihama, U.S. Pat. No. 5,126,165. Akihama suggested an apparatus and a method for depositing material of a predetermined velocity. Direction selection is made with a plate having an aperture that selects material in the direction of 0.022 steradian with the normal to the target surface. Velocity selection is done using a chopper through which material is allowed to pass only for a predetermined time. In addition, a predetermined dc voltage is applied between the target and substrate to control the spatial and time distributions of charged particulates arriving at the substrate. The velocity method disadvantageously relies upon differing species velocities which may not completely separate desirable ions from undesirable particulates. The velocity filter method has also been used to measure the velocity distribution of micron-size particulates, as well as atomic and ionic species present in the laser ablation plume. Particulate velocities have been found to be on the order of a few hundred meters per second while those of atomic and ionic species were an order of magnitude larger. This suggests that it would be possible to use velocity selection of species in the plume to prevent large particulates from depositing on a substrate. The velocity filter method has also been adapted to use an electronically actuated shutter, placed between the target and substrate. If a velocity filter is to prevent the entire velocity distribution of large particles from reaching the substrate, a significant fraction of atomic size particles will also be filtered out and the growth rate of the film will disadvantageously drop to almost zero.

U.S. Pat. No. 5,660,746 teaches the dual laser method for forming a film with reduced particulate density using a dual-laser deposition process. The preferred embodiment includes the spatial overlap of two laser pulses on a target, with the lasers being of different wavelengths. The first laser irradiates the target surface to form a molten layer, while the second laser generates a plume from the molten layer. The two pulses have a predetermined delay with respect to each other so as to control the ejection and subsequent deposition of particulates on the substrate. The dual laser method disadvantageously requires the use of two lasers having temporal delays when the first $CO_2$ laser forms a molten layer on the target and the second UV laser vaporizes the molten target.

A PLD magnetic duct method uses a magnetic duct positioned in the deposition chamber to drag ions along the field lines of a weak curved magnetic field which is uniform along the curved ion path. The method teaches to provide magnetic fields sufficient to "magnetize" and affect the direction of flight of electrons in the plasma. The magnetic field strength is disadvantageously not sufficient to magnetize the ions used for thin film formation. The method suggests that when the electrons are magnetized and the ions are not, the ions tend to drift towards the outer wall of the duct, and not be deposited on a substrate. Jordan et al's magnetic duct PLD method teaches the use of magnetic duct to create a uniform magnetic field to guide electron species along the field lines toward the substrate, and disadvantageously does not apply a sufficiently strong force upon the ablated ions to guide them toward the substrate for the creation of quality thin films.

The predominant problem with PLD methods is the creation and deposition of large particulates that impose a limitation on the applications. Despite numerous advantages of the PLD method, its commercialization has been slow, primarily because of the particulate problem, that has been difficult to solve. These and other disadvantages or problems are solved or reduced using the present invention.

SUMMARY OF THE INVENTION

An object of the present invention is to form high quality thin films using a pulsed laser deposition (PLD) chamber wherein a laser beam ablates a target material creating a plume of ions diverted and deposited onto a substrate using a magnetic field.

Another object of the present invention is to form high quality thin films using a pulsed laser deposition chamber wherein a laser beam ablates a target material creating a plume of ions diverted and deposited onto a substrate using a magnetic field while preventing deposition of plume species ejected from the target in a direct line of sight between the target and substrate.

Another object of the present invention is to form high quality thin films using a pulsed laser deposition chamber wherein a laser beam ablates a target material creating a plume of ions diverted and deposited onto a substrate using a magnetic field while preventing deposition of plume species ejected from the target in a direct line of sight between the target and substrate, and while not diverting neutral or large charged particles so as to prevent the deposition on the substrate of neutral or large charged particles ejected from the target.

The present invention relies upon a free space magnetic field in a pulsed laser deposition chamber in which ions from the plume are diverted according to the v×B right hand rule. The magnetic field exerts a Lorentz force upon the ions to deflect them orthogonal to both their initial direction of travel and to the magnetic field, toward the substrate, while neutral particulates continue unaffected past the substrate. A preferred permanent magnet is used to separate charged species present in the laser ablation plume from neutral species, that typically include the undesirable particulates. The magnetic field deflects charged species from the primary direction of travel of the plume by means of a (qv×B) Lorentz force which does not affect neutral species. The deflection occurs in free space without the use of a magnetic conduit. The magnetic field deflects the charged species away from the primary direction of travel of the plume and toward the substrate for deposition of the charged ion species on the substrate. The desired substrate is positioned such that it collects the deflected charged species to produce a thin film. The neutral species of the plume that typically include the undesired heavy and large particulates experience no effect of the magnetic field and proceed undeflected along a straight path. A simple mechanical shield is positioned in the direct line of sight between the target and the substrate to prevent any particulates in direct line of sight between the target and substrate from reaching the substrate. The substrate can be biased to increase the ion yield at its surface. The substrate can be held at room temperature or at any other elevated temperature using a substrate heater. The resulting film on the substrate is essentially free of particulates. The combination of the magnetic field and a bias applied to the substrate offers the advantage of reducing particulate densities without a significant reduction in film growth rate.

The present invention does not require a parallel geometry as does the substrate for off-axis deposition, does not use mechanical velocity selections of various particulates in the plume, does not use dual lasers, but rather uses a single laser and a single magnet. The present invention produces extremely clean films with highly reduced particulate densities and size, and having appreciable deposition rates. This method favors useful film properties, such as crystallinity and good adhesion, even at room temperature, because it relies upon using high energy ions for the deposition. The method therefore has tremendous potential for applications where the substrate is thermally sensitive.

The invention is relatively inexpensive and very simple to implement using conventional components while being insensitive to any deposition on the magnet itself, since this does not alter the magnetic field with continued use of the magnet inside the deposition chamber. A standard PLD system can be modified with a magnet and a substrate shield, without the use of a background gas and without the added costs and complications of a gas delivery system and pressure regulation. The present invention may be applied to the production of a film of any material. These and other advantages will become more apparent from the following detailed description of the preferred embodiment.

DETAILED DESCRIPTION OF THE PREFERRED EMBODIMENT

Figure 1:
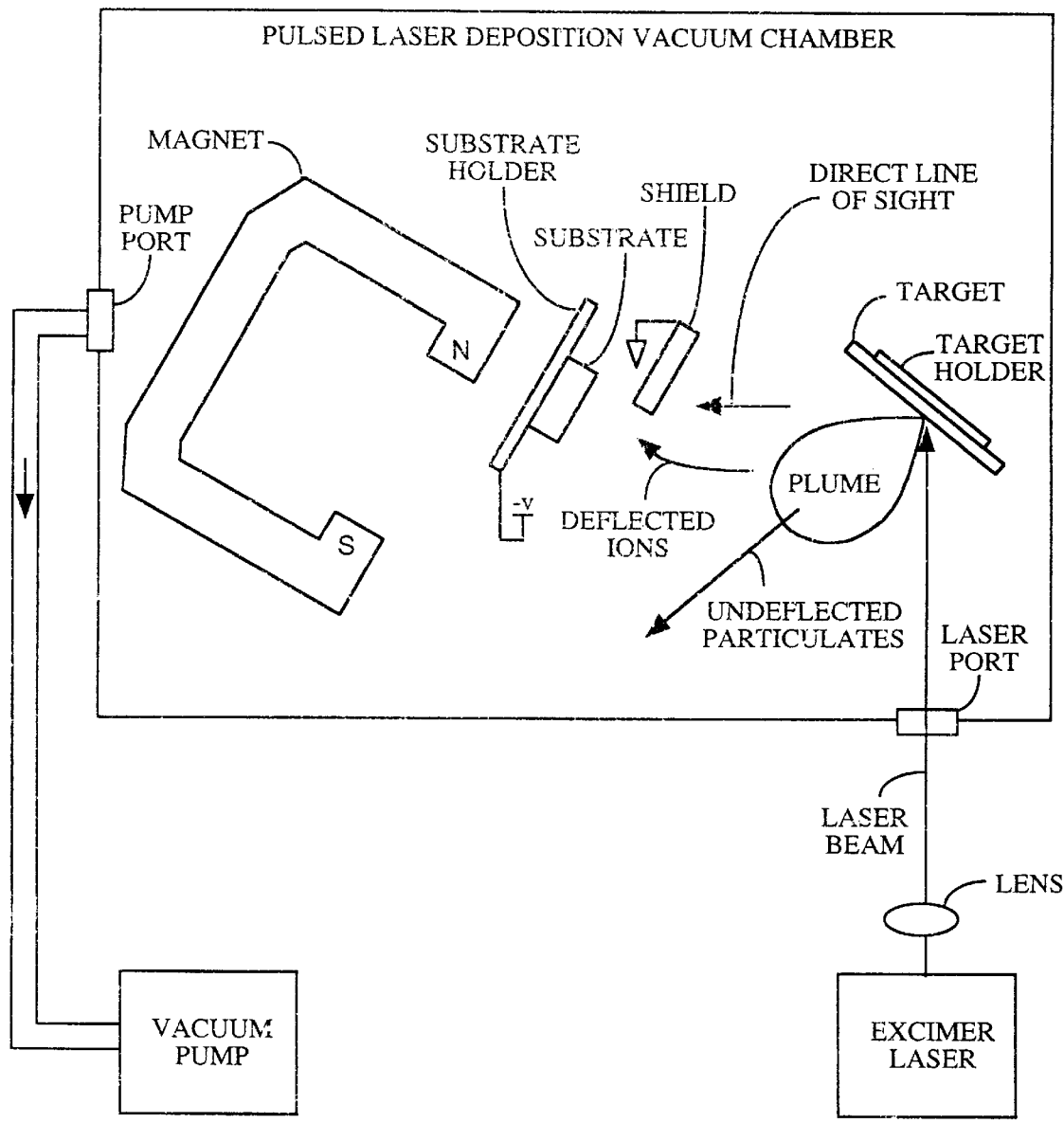
FIG. 1 is a block diagram of a magnetic field pulsed laser deposition system.
Figure 2:
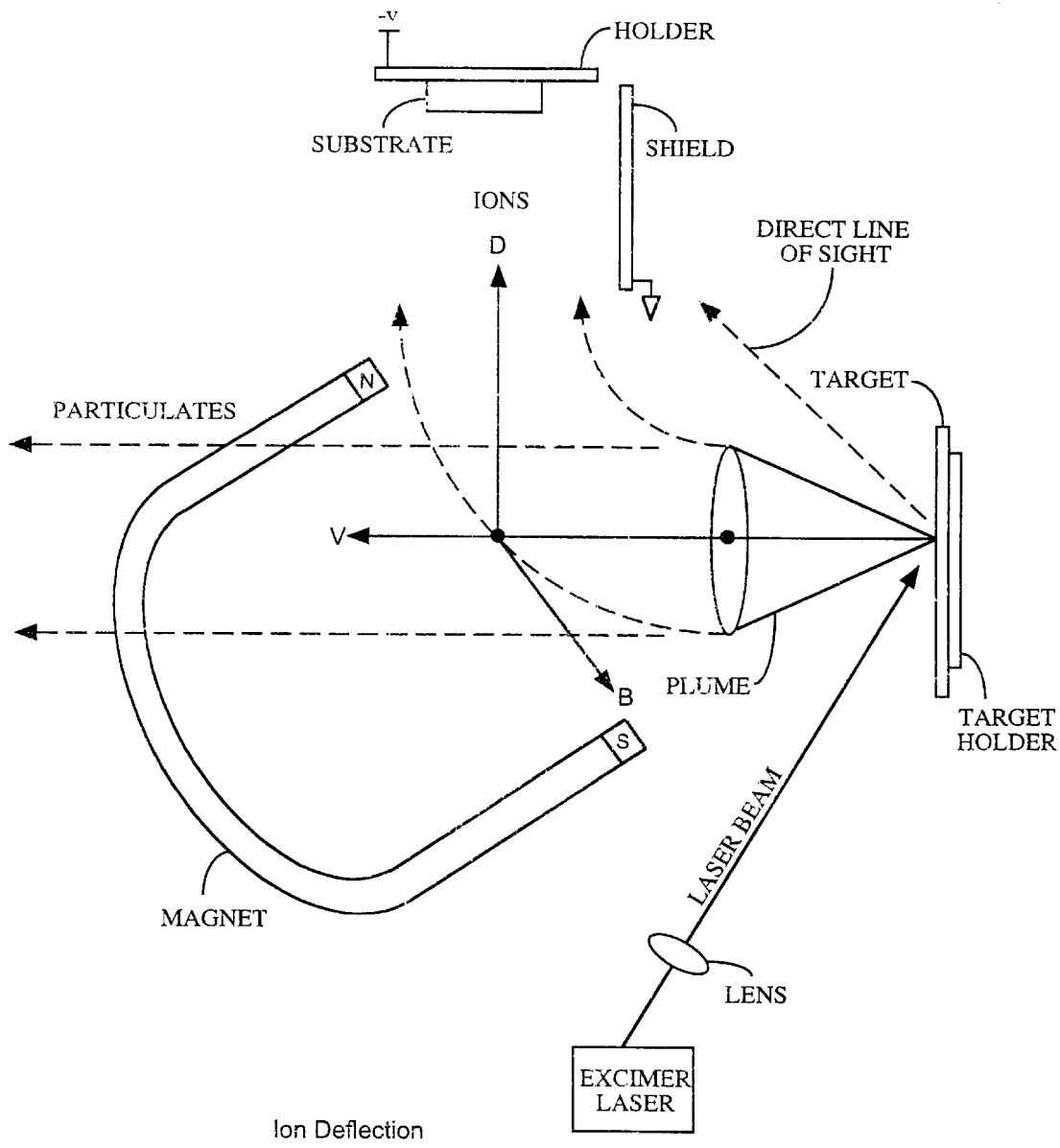
FIG. 2 is a block diagram depicting ion deflection in the magnetic field pulsed laser deposition system.

Referring to the FIGS. 1 and 2, the magnetic field pulsed laser deposition (PLD) system is used for obtaining highly uniform and smooth films with the PLD process. An excimer laser operating with KrF at a wavelength of 248 nm, and having a pulse width that is typically 30 ns provides a laser beam. The laser beam is focused on the target of choice, held in a target holder inside a vacuum chamber, with a lens positioned outside the chamber. Typical laser fluences are 1–15 J/cm$^2$. The vacuum chamber is maintained at a base pressure of $1\times10^{-7}$ to $1\times10^{-8}$ torr and should be less than $10^{-4}$ torr. The substrate of choice is placed in a substrate holder inside the vacuum chamber. The substrate can be any solid material which is appropriate because of its mechanical, optical, electronic, or chemical properties. The target is positioned in a conventional target holder, that is rotated at a speed of approximately 1000 RPM during deposition. The target can be any solid, laser-ablatable material. In the exemplar configuration, a target of a material is used to deposit a film of the same material. A reactive gas or buffer could be introduced into the vacuum chamber that reacts with the plasma plume forming a new material which is still ionized and will still be deflected towards the substrate. A constituent specie of the target will nonetheless still be deposited on the substrate. For example, a nitrogen reactive gas and a TiC target may produce ionized TiCN that is deflected and deposited. For another example, a methane gas $CH_4$ with a Ti target can be used to deposit TiC films. The target is rotated by a target holder, while being exposed to the pulsed laser beam, for uniform ablation. The target holder is positioned at a forty five degree angle with respect to the incoming laser beam. The substrate holder can be a rotating substrate holder, for example at 1000 RPM, for improved uniformity of the deposited film. The substrate can be electrically biased, for example from zero to –30 volt DC for improving the rate of film growth. The substrate can be heated to a high temperature, for example up to 700° C., but can also be maintained at room temperature 25° C. A permanent magnet with a field strength of 1000–4000 Gauss at the poles and 400–700 Gauss between the poles is positioned inside the vacuum chamber, approximately three to four inches from the target. The magnet is oriented such that the plume extends into the region between the two poles. The magnet is positioned such that the height of magnet is at the center of the target. The magnetic field can be generated using a variety of magnetic means, such as a permanent magnet, an electromagnet or a quadrapole with an exemplar range of 100 to 10,000 Gauss.

The lens may be a focusing means where the focused laser light can provide a sufficient power density to generate a laser induced plasma plume from the target. When the laser beam is focused upon the target, the ablation plume is initially directed in part toward the magnet. Ions in the plume are deflected upwards as the ions experience the magnetic field at the poles. The substrate is held face down in a substrate holder positioned horizontally above the magnet. The substrate is positioned slightly in front of the north pole of the magnet, where the magnetic field and therefore the upward ion plume deflection is the strongest. Conventional substrate cleaning involves several ultrasonications in heptane, followed by drying in a stream of dry nitrogen gas. Prior to loading in the vacuum chamber, any organic residue or other contamination on the substrate surface is removed by laser ablation using the same excimer laser. The substrate is maintained at room temperature, and can be heated if necessary in to improve film adhesion and/or crystallinity. The substrate can be biased, floated, or held at ground potential.

A small shield preferably consisting of a copper plate of one by three inches, is lined up in front of the substrate, such that it shields the substrate from any particulates that can reach the substrate from the target through a direct line-of-sight trajectory between the target and substrate.

Using this magnetic field PLD system, extremely clean and uniform coatings of polycrystalline TiC have been obtained on 52100 bearing steel flats and races at room temperature. Following deposition, the film morphology can be observed with a scanning electron microscope for verification of films growth and quality. The resulting TiC films are harder than steel and are polycrystalline even when deposited at room temperature. This magnetic field PLD system eliminates all particulates with average sizes greater than one half micron as an improvement over the conventional PLD processes that has a high density of particles sizes from one to five microns. The particulate density using the present invention is less than 10/cm$^2$/Å which is a factor of forty lower than for a standard line-of-sight PLD processes. Exemplar substrates include 52100 steel, 440C steel, REX20 steel, silicon, silicon nitride, silicon dioxide, copper or aluminum.

The magnetic field PLD system demonstrates particulate reduction without sacrificing film growth rate. Particulates larger than one half microns are eliminated, and extremely low densities of less than 10/cm$^2$/Å are observed for particulates smaller than one half micron in size. The growth rate is high at 0.6 $\mu$m per hour with the laser operating at fifty Hertz. The preferred magnetic field PLD system can easily be scaled up by using higher laser repetition rates available in many commercial laser sources. The magnetic field PLD system not only provides uniform films having no large particulates, but also tends to create desirable crystalline films having good adhesion to the substrate.

The magnetic field PLD system uses a permanent magnet to deflect ablated ions to achieve uniform films. The magnet may be positioned anywhere in front of the plume. The deflection of the plume is clearly visible, therefore positioning the substrate is straightforward. A separate mechanical shield prevents particles from hitting the substrate. In addition to using a permanent magnet, electromagnets or a quadrapole may also be used. Those skilled in the art of PLD can make enhancements and improvements to the preferred magnetic field PLD system and method, but those improvements and enhancements may nonetheless fall within the spirit and scope of the following claims.

What is claimed is:

1. A method of depositing a thin film on a substrate, the method comprising the steps of, ablating a target with a laser beam creating a plume having charged species and neutral species, shielding the substrate to prevent species of the plume from traveling from the target to the substrate through a direct line of sight between the target and the substrate, and deflecting by a magnetic field the charged species in the plume towards the substrate to deposit the charged species on the substrate, the deflection being orthogonal to the plume and to the magnetic field, the deflection is an orthogonal v×B Lorentz magnetic deflection with the magnetic field having a vector B, the charged species having a velocity vector v, and the deflection being orthogonal to both vectors v and B to orthogonally deflect the charged species around the shielding and towards the substrate.

2. The method of claim 1 wherein the target and thin film consist of titanium carbide, and the substrate is made of steel.

3. The method of claim 1 further comprising the step of focusing the laser beam onto the target.

4. The method of claim 1 wherein the ablating step comprises the steps of rotating the target to periodically expose a surface of the target to the laser beam to ablate the surface of the target to create the plume, and focusing the laser beam onto the target.

5. The method of claim 1 wherein the laser beam is a pulsed laser beam.

* * * * *